United States Patent
Biran et al.

(10) Patent No.: US 7,692,561 B2
(45) Date of Patent: Apr. 6, 2010

(54) METHOD AND APPARATUS FOR DATA DECOMPRESSION IN THE PRESENCE OF MEMORY HIERARCHIES

(75) Inventors: Giora Biran, Zichron-Yaakov (IL); Hubertus Franke, Cortlandt Manor, NY (US); Amit Golander, Tel-Aviv (IL); Hao Yu, Valhalla, NY (US)

(73) Assignee: International Business Machines Corporation, Armonk, NY (US)

( * ) Notice: Subject to any disclaimer, the term of this patent is extended or adjusted under 35 U.S.C. 154(b) by 68 days.

(21) Appl. No.: 12/175,214

(22) Filed: Jul. 17, 2008

(65) Prior Publication Data
US 2010/0013678 A1    Jan. 21, 2010

(51) Int. Cl.
*H03M 7/34* (2006.01)
(52) U.S. Cl. ............... 341/51; 341/50
(58) Field of Classification Search ......... 341/50, 341/51; 370/401
See application file for complete search history.

(56) References Cited

U.S. PATENT DOCUMENTS

| | | | |
|---|---|---|---|
| 6,263,413 B1 | 7/2001 | Motomura et al. | |
| 6,557,083 B1 | 4/2003 | Sperber et al. | |
| 6,819,271 B2* | 11/2004 | Geiger et al. | 341/51 |
| 6,885,319 B2* | 4/2005 | Geiger et al. | 341/51 |
| 7,129,860 B2* | 10/2006 | Alvarez et al. | 341/51 |
| 2003/0058873 A1* | 3/2003 | Geiger et al. | 370/401 |
| 2004/0045030 A1* | 3/2004 | Reynolds et al. | 725/110 |

FOREIGN PATENT DOCUMENTS

CN   1561007   1/2005

OTHER PUBLICATIONS

Lee, Jung-Hoon et al., "Application-Adaptive Intelligent Cache Memory System", ACM Transactions on Embedded Computing Systems, vol. 1, No. 1, Nov. 2002, pp. 56-78.
Sterpone, Luca et al., "A New Decompression System for the Configuration Process of SRAM-Based FPGAs", GLSVLI'07, Mar. 11-13, 2007, Stresa-Lago Maggiore, Italy, pp. 241-246.

* cited by examiner

*Primary Examiner*—Jean B Jeanglaude
(74) *Attorney, Agent, or Firm*—F. Chau & Associates

(57) ABSTRACT

A method for decompressing a stream of a compressed data packet includes determining whether first data of a data-dictionary for a first decompression copy operation is located in a history buffer on a remote memory or a local memory, and when it is determined that the first data is located in the remote memory, stalling the first decompression copy operation, performing a second decompression operation using second data that is located in the history buffer on the local memory and fetching the first data from the remote memory to the history buffer on the local memory. The method further includes performing the first decompression operation using the first data in the history buffer on the local memory.

20 Claims, 15 Drawing Sheets

FIG. 7a

```
Load Unit

701.  INFINITE-LOOP
702.    IF (stall-queue is not empty) THEN
703.       A = get the head request <S,D,L> from stall-queue
704.       Compute <S',L',D'> from <S,D,L>
705.       IF (S+L < hist-offset) THEN
706.          Load <S',L'> from remote memory into D'
707.          Enqueue a request <D',D,L> into the ready-queue
708.          dequeue <S,D,L> from stall-queue
709.       ELSE IF (S >= hist-offset) THEN
710.          Enqueue request <S,D,L> into the ready-queue
711.          dequeue <S,D,L> from stall-queue
712.       ELSE
713.          modify the head request of stall-queue from <S,D,L>
                     to <hist-off, D+(hist-off - S), L-(hist-off - S)>
714.          Load <S',L'> from remote memory into D'
715.          Enqueue a request <D',D,L> into the ready-queue
716.       ENDIF
717.    ENDIF
718. ENDLOOP
```

FIG. 7b

```
Compute <S',L',D'> from <S,D,L>
 ▪   S' : source address in the remote memory, aligned to the load unit (e.g., cache line)
 ▪   L' : number of load units to be loaded from the remote memory.
 ▪   D' : address in the outstanding-buffer to hold the data loaded from remote memory.

721. S' = RM-address( S ) with RM block alignment
722. L' = Ceiling( (hist-off - S') / RM-block-size )
723. D' = outstanding-buffer free pointer
```

FIG. 8

```
Decoder/Selector

801. IF (LE ready-queue has instructions) THEN
802.   Put one copy instruction, <S,D,L> into CE instr-buffer
803.   Increment "Commit Pointer" by L
804.   Signal CE for work
805. ELSE
806.   Read an instruction, A, from fixed-buffer
807.   Convert the instruction into <S,D,L>
808.   IF (S >= history-offset) THEN
809.      Put <S,D,L> into CE instr-buffer
810.      Signal CE for work
811.      IF (commit-ptr = outstanding-ptr) THEN
812.         Increment both pointers by L
813.      ELSE
814.         Increment outstanding-ptr by L
815.      ENDIF
816.   ELSE
817.      IF (LE stall-queue is full) THEN
818.         Wait until the stall-queue is not full
819.      ENDIF
820.      Put <S,D,L> into LE stall-queue
821.      Increment outstanding-ptr by L
822.   ENDIF
823. ENDIF
```

FIG. 9

```
Convert instruction in Fix-Buf to <S,D,L> format
  • Input: <literal> for literal op; <distance, length> for copy op
  • Output: <S,D,L> for copy source, copy destination, copy length 901. IF (instruction is for literal op) THEN
902.   D = outstanding-ptr
903.   S = D
904.   L = the literal
905. ELSE
906.   D = outstanding-ptr
907.   S = D - distance
908.   L = length
909. ENDIF
```

FIG. 10

```
Copy Engine (CE)
▪   Input: <S,D,L>

1001. IF (S = D) THEN
1002.   Write a single byte L into hist-buf at D
1003. ELSE
1004.   IF (S refers to outstanding-buffer) THEN
1005.     Copy L bytes from outstanding-buffer into
          history-buffer at D.
1006.   ELSE
1007.     Copy L bytes from S to D inside history-buffer.
1008.   ENDIF
1009.ENDIF
1010.Signal Decoder indicating CE-ready
```

METHOD AND APPARATUS FOR DATA DECOMPRESSION IN THE PRESENCE OF MEMORY HIERARCHIES

BACKGROUND

1. Technical Field

The present disclosure relates generally to the acceleration of data decompression, and more particularly to the acceleration of dictionary-based data decompression in a networked environment.

2. Discussion of Related Art

Websites are increasingly more complex and rely on dynamic content and dynamic scripting languages to enhance the user experience. Such complex websites use a large amount of the available bandwidth and benefit from the use of data compression technologies. As an example, HTTP/1.1 incorporates HTTP message body compression by means of content encoding.

One conventional compression/decompression algorithm, Deflate, implements the Lempel-Ziv (LZ) compression algorithm. The LZ compression algorithm identifies substrings in input streams that have occurred in the past and replaces each substring with a reference distance and a length. The resulting compressed stream includes a sequence of literal requests and copy requests, which are referred to as tokens. The tokens may be further compressed using Huffman encoding. Deflate is used in conventional compression programs such as gzip and zip. The reference distances may be limited to a predetermined size (e.g., 32K bytes) for efficiency reasons.

The decompression is achieved in reverse order by performing Huffman decoding followed by Lempel-Ziv decompression. In LZ decompression, an input pointer processes each record of the compressed stream. For a literal request, the literal is copied from the input buffer to an output buffer (e.g., a history buffer). For a copy request, a string is copied from the existing history (e.g., a data-dictionary) to the end of the output buffer.

FIG. 1 illustrates a conventional implementation of the Deflate decompression algorithm. Variable length tokens are extracted from a compressed input stream and placed in an input buffer 101. The variable length tokens can then be decoded using a variable length token decoder 105 and a Huffman code table 106 to generate fixed length tokens for storage in a fixed length token buffer 104. The fixed length tokens can then be presented to a LZ decompression unit 105 that either copies a literal from the token or uses a reference distance of the token to copy data from the recent history of the output buffer 102.

Decompression algorithms like LZ decompression are being increasingly implemented in hardware, such as in individual chip cores, as decompression engines. However, since the amount of available chip area is limited, typically only a small number of decompression engines can be accommodated.

In stateless decompression, the inputs of different decompression requests can be independently processed. In conventional stateless decompression, all segments of a compressed data stream generated by a single compression operation must be received and presented at once to an acceleration engine. The magnitude of open connections that might carry compressed state can be in the thousands for enterprise servers. For systems like intrusion prevention systems the number of routed open connections can be in the order of millions. The requirement to have the entire compressed data stream available can create significant memory pressure on the system, which could be exploited in a service attack. Alternatively, a decompression engine can be dedicated to a particular stream from the first to the last packet of a compressed stream and thus packets could be decompressed one after the other. However, due to network traffic delays, packets belonging to a compressed stream might arrive in a sequence of bursts due to the network protocol (e.g. TCP/IP) and they typically span multiple seconds or longer. Hence the number of concurrent connections that can be handled at a time is limited to the number of decompression engines. In addition, this method can be exploited by attacks that do not send all of the packets.

In some intrusion prevention systems, decompressed content must be inspected on a per-packet level to detect intrusions as early as possible so the packets can be either rejected or forwarded based on that analysis. Given the large number of connections that might require simultaneous decompression (e.g., 1 million or more), coupled with the necessity to decompress data streams on a per-packet basis, the system responsible for the decompression needs to be able perform efficient stateful decompression. In stateful decompression, different decompression operations are allowed to share the same state (e.g., the same data-dictionary). For example, in a packet deep inspection system, while the compression at the sender side is done at a flow (e.g., a stream) level, the inspection is done at a packet level where packets for the multitude of flows arrive interspersedly. However, the high concurrency of network traffic extends to the decompression accelerator and forces the decompression accelerator to maintain the state of each compressed flow.

Thus, there is a need for methods and systems for decompressing a stream of compressed data packets that can minimize the overhead of moving the decompression state (e.g., all or part of a data-dictionary) between local and remote memory spaces.

SUMMARY

An exemplary embodiment of the present invention includes a method for decompressing the compressed data of a packet associated to a stream packets. The method includes determining whether first data of a data-dictionary for a first decompression operation is located in a history buffer on a remote memory or a local memory, and when it is determined that the first data is located in the remote memory, stalling decompression of the first decompression operation, performing a second decompression operation using second data of the data dictionary that is located in the history buffer on the local memory and fetching the first data from the remote memory to the history buffer on the local memory. The method further includes performing the first decompression operation using the first data in the history buffer on the local memory.

The method may include the stalling of multiple decompression operations. For example, when the data for decompressing the second decompression operation is present in the remote memory or its data overlaps with the output data of the first stalled decompression operation, both the first and second decompression operations are stalled. Then the data associated with the decompression of the first and/or the second decompression operations can be fetched in the background while a third decompression operation whose associated data is present in the local memory is performed.

The above described method may be performed on a general purpose processor. The remote memory may be main memory and the local memory may be a cache. The decompressing may be performed using Lempel-Ziv decompression. The stalling may include reserving a space in the history buffer on the local memory that is sufficient in size to fit the first data. The fetching of the first data may include copying the first data from the remote memory to the reserved space in the history buffer on the local memory. The performing of the second decompression operation may include outputting the second data into the history buffer on the local memory after the reserved space.

The decompressing method may initially perform a prefetching of a portion of the data-dictionary into the history buffer on the local memory. The decompressing method further stores data of the data-dictionary used in a recent decompression into a caching region of the history buffer on the local buffer. When the caching region is used, the determining of whether the first data is located in the history buffer may proceed by checking whether the first data is present in a region of the history buffer containing newly generated history, checking whether the first data is present in a region of the history buffer containing prefetched recent history, and checking whether the first data is present in the caching region. The three checks may be performed in sequential order.

An exemplary embodiment of the present invention includes a system that includes a decompression engine. The system includes a history buffer and a decompression unit. The history buffer is configured to store data of a data-dictionary associated with the compressed data stream. The decompression unit is configured to asynchronously fetch data of the data-dictionary from a remote memory to the history buffer, to delay decompression of a current decompression operation until its corresponding data has been fetched, and to perform a subsequent decompression operation based on the data in the history buffer while the current decompression operation is delayed.

The history buffer may include a committed region and an outstanding region, wherein the committed region includes contiguous data of the data-dictionary used in prior decompression operations and the outstanding region includes at least one space reserved for data of the data-dictionary corresponding to the delayed decompression operations. The history buffer may further include a caching region for storing data of the data-dictionary that was previously copied from the remote memory when performing decompression operations. The caching region may be associated with a bit vector indicating whether a unit of the data in the caching region contains valid data.

The system may further include a commit pointer for referencing the committed region, where the commit pointer is advanced after the completion of each delayed decompression operation. The commit pointer may be advanced after each copy into the history buffer when there is no delayed decompression operation.

The system may further include output unit that is configured to asynchronously store a part of the data in the history buffer to the remote memory. The system may further include a Huffman decoding unit to decode the compressed data packet into fixed length tokens. The decompression unit may perform the decompression using Lempel-Ziv decompression. The Huffman decoding unit may operate asynchronously with the Lempel-Ziv decompression performed by the decompression unit in a pipelined fashion.

The decompression unit may include a load engine, a copy engine, and a selector. The load engine is configured to retrieve data of slow copy operations and store the retrieved data on the engine. The data of the slow copy operations corresponds to data of the data-dictionary of the remote memory. The copy engine is configured to copy literals of literal operations and data of fast copy operations to the history buffer. The data of the fast copy operations corresponds to data in the history buffer. The selector is configured to route the fast copy operations and literal operations to the load engine and route the slow copy operations to the load engine.

The load engine may further include an outstanding buffer, a ready queue, a stall queue, and a load unit. The stall queue is configured to store the slow copy operations. The load unit is configured to retrieve a slow copy operation from the stall queue, load the data of the slow copy operation from the remote memory into the outstanding buffer, modify the slow copy operation to generate a new fast copy operation, and place the new fast copy operation into the ready queue.

BRIEF DESCRIPTION OF THE SEVERAL VIEWS OF THE DRAWINGS

Exemplary embodiments of the invention can be understood in more detail from the following descriptions taken in conjunction with the accompanying drawings in which:

FIGS. 7a and 7b show pseudocode for logic of a Load Unit of FIG. 6, according to an exemplary embodiment of the present invention;

FIG. 8 shows pseudocode for logic of the Decoder/Selector of FIG. 6, according to an exemplary embodiment of the present invention;

FIG. 9 shows pseudocode for logic of an instruction conversion performed in the pseudocode of FIG. 8, according to an exemplary embodiment of the present invention;

FIG. 10 shows pseudocode for logic of a Copy Engine of FIG. 5, according to an exemplary embodiment of the present invention;

DETAILED DESCRIPTION

In general, exemplary embodiments of the invention as described in further detail hereafter include systems and methods which decompress compressed data segment of a compressed data stream. It is to be understood that the methods described herein may be implemented in various forms of hardware, software, firmware, special purpose processors, or a combination thereof. In particular, at least a portion of the present invention is preferably implemented as an application comprising program instructions that are tangibly embodied on one or more program storage devices (e.g., hard disk, magnetic floppy disk, RAM, ROM, CD ROM, etc.) and executable by any device or machine comprising suitable architecture, such as a general purpose digital computer having a processor, memory, and input/output interfaces. It is to be further understood that, because some of the constituent system components and process steps depicted in the accompanying figures are preferably implemented in software, the connections between system modules (or the logic flow of method steps) may differ depending upon the manner in which the present invention is programmed. Given the teachings herein, one of ordinary skill in the related art will be able to contemplate these and similar implementations of the present invention.

Figure 2:
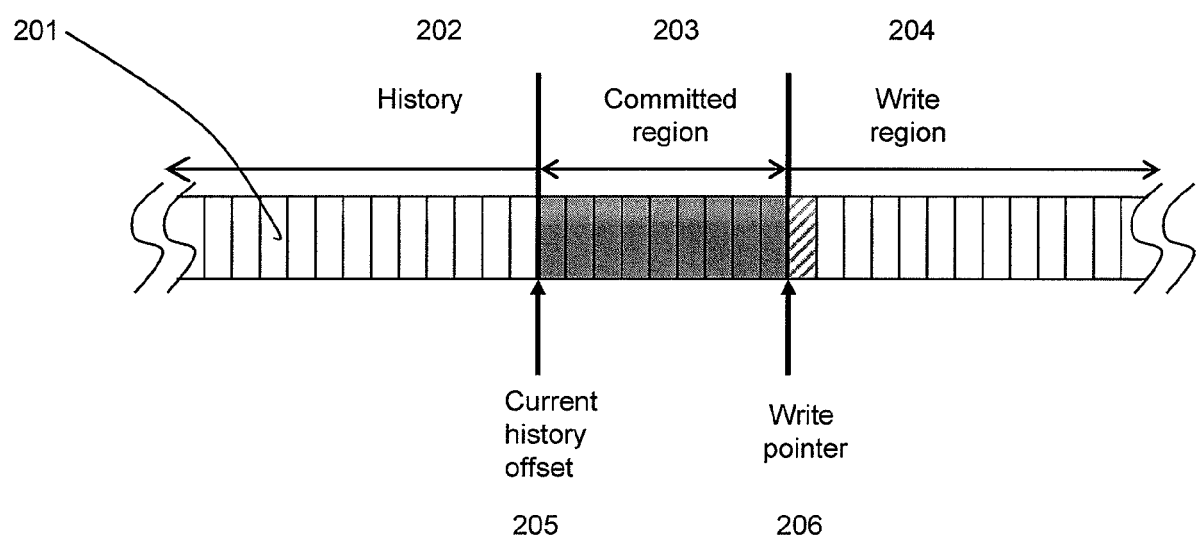
FIG. 2 shows a history buffer partitioned conventionally for processing a decompression operation.

FIG. 2 shows a history buffer partitioned in a conventional manner for processing a decompression operation (e.g., either a literal operation or a copy operation). The history buffer 201 includes three regions, a History Region 202, a Committed Region 203, and a Write Region 204. The History Region 202 holds dictionary-data (e.g., history data) used for and generated by decompressing data of previous decompression requests, corresponding to previous packetized data segments of the same data stream. The Committed Region 203 holds the history data (a.k.a. decompression output) of an on-going decompression request. The data held in the Committed Region 203 is also referred to as "current history". The Write Region 204 is used for storing the decompression output associated with yet to be processed decompression operations. The history buffer 201 is referenced using two pointers, a Current History Offset Pointer 205 and a Write Pointer 206.

The history buffer 201 typically resides in a high speed memory such as a cache or accelerator memory. Since the history buffer 201 has a limited size, some of the history data associated with the decompression of previous data segments (e.g., packets) of the same data stream will reside in a remote history (e.g. in a remote memory, such as main memory), while the rest resides in the history buffer 201. Certain compressed data packets will require data from the remote memory for their decompression. However, the delay associated with transferring the data from remote memory delays the decompression process.

Accordingly, an exemplary embodiment of the present invention loads history data on-demand during the execution of decompression copy operations. The copy operations can be classified into fast and slow copy operations. A fast copy operation has its source data available in a local or a high speed memory. A slow copy operation either does not have all of its source data available in the local or high speed memory or part of its source data depends on another slow copy. Whenever a slow copy operation is encountered, the slow copy operation is set aside, and a hole is left in the history buffer. The history buffer may include multiple holes, each corresponding to a different slow copy operation. The decompression continues to operate on the fast copy operations. While the fast copy operations are being performed, the source data of the slow copies can be fetched asynchronously in the background from the remote or slow memory to the local or fast memory. Whenever the source data of a pending slow copy has been fetched into the local or fast memory, the pending slow copy is ready to be executed. The scheme may be referred to as a fetch-on-demand or asynchronous fetch-on-demand scheme, which facilitates an "out-of-order" execution of the fast copy operations that overlap with the loads of history data from the remote or slow memory (e.g., main memory) for the slow copy operations.

Figure 3:
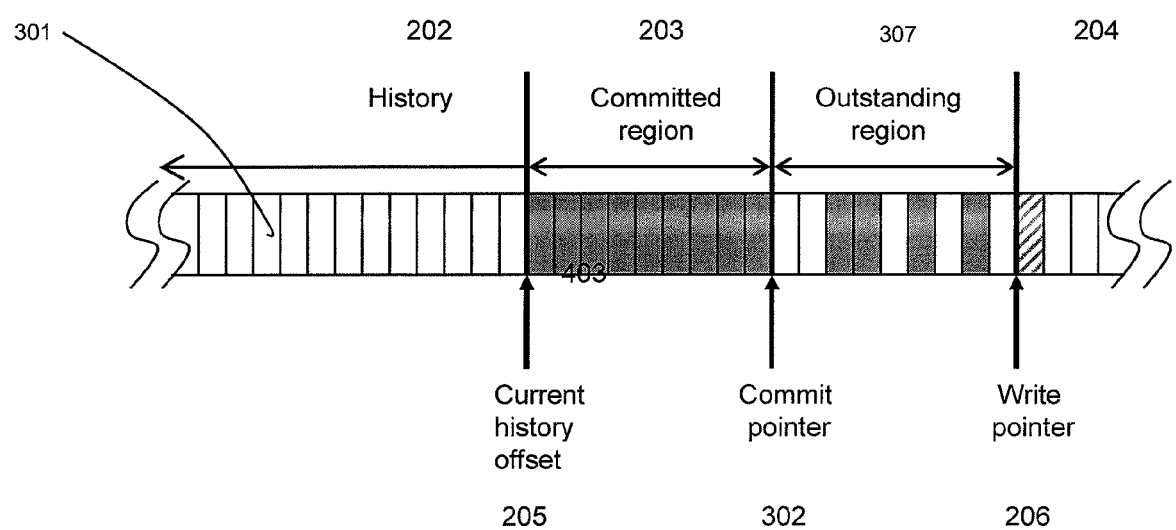
FIG. 3 shows a history buffer partitioned for processing a decompression operation according to an exemplary embodiment of the present invention.

FIG. 3 shows a way of partitioning the history buffer 201 in FIG. 2 to facilitate the above described fetch-on-demand scheme. As shown in FIG. 2, conventional decompression maintains a write pointer 206, which is updated after each copy or literal operation. However, different from the history buffer partitioning shown in FIG. 2, the history buffer 301 of FIG. 3 includes an Outstanding Region 307. Further, the history buffer 301 of FIG. 3 is additionally referenced using a Commit Pointer 302. The Commit Pointer 302 separates the Committed Region 203 from the Outstanding Region 307. The Committed Region 203 includes output of the completed copy and literal operations. Data in the Committed Region 203 is ready to be written to a remote memory, such as main memory. The Outstanding Region 307 contains outputs of fast copy operations and holes corresponding to the slow copy operations. Whenever a slow copy operation has completed, a hole in the Outstanding Region 307 is filled, and the Commit Pointer 302 can then be advanced. The size of the Outstanding Region 307 can be kept to a minimum by filling the holes in order. In-order commits can reduce the number of pending slow copy operations that indirectly depend on the remote memory, thereby improving the efficiency of the overall decompression.

Figure 1:
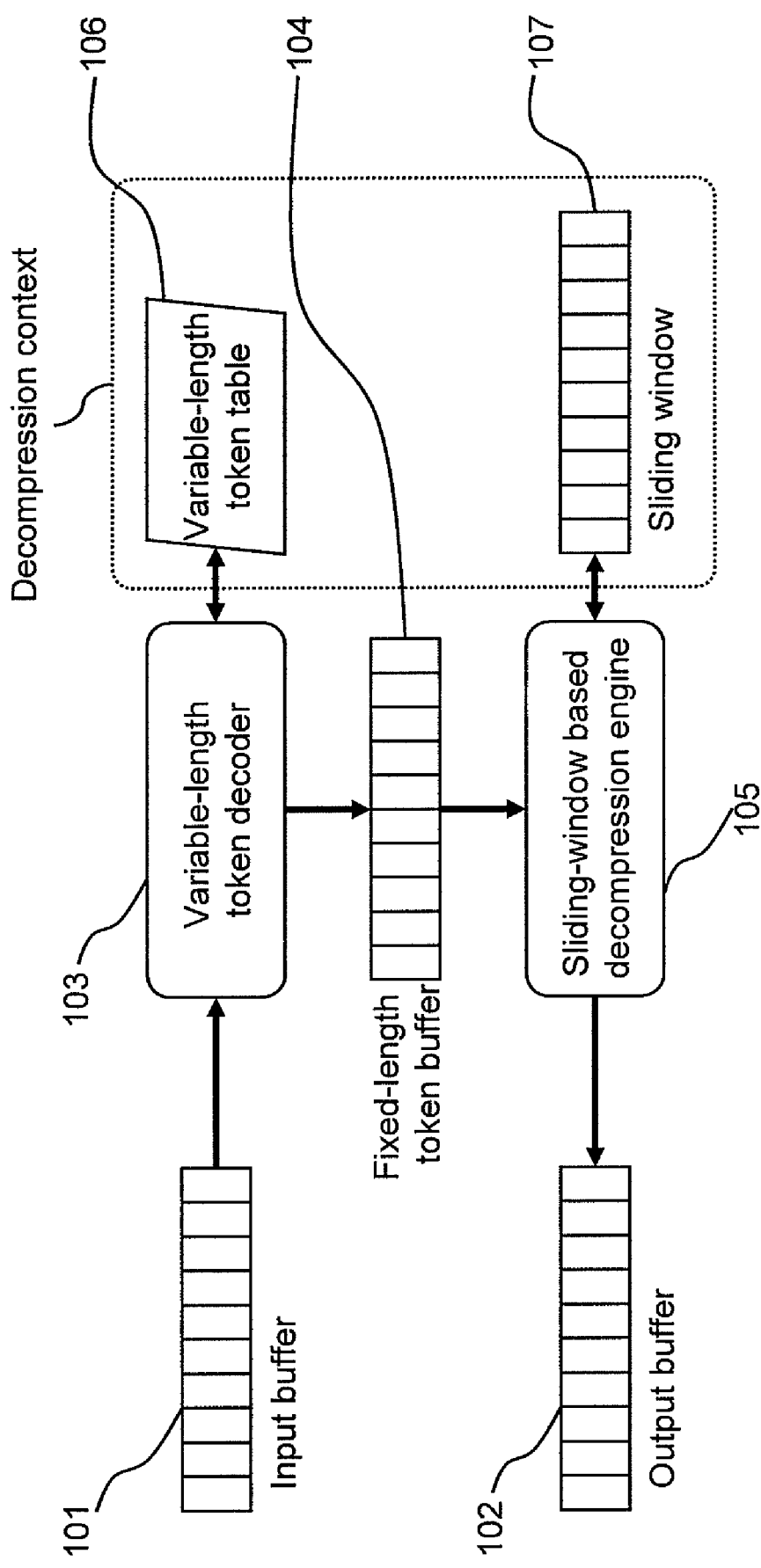
FIG. 1 shows a high-level block diagram a conventional decompression accelerator/engine that implements a Deflate decompression algorithm.
Figure 4:
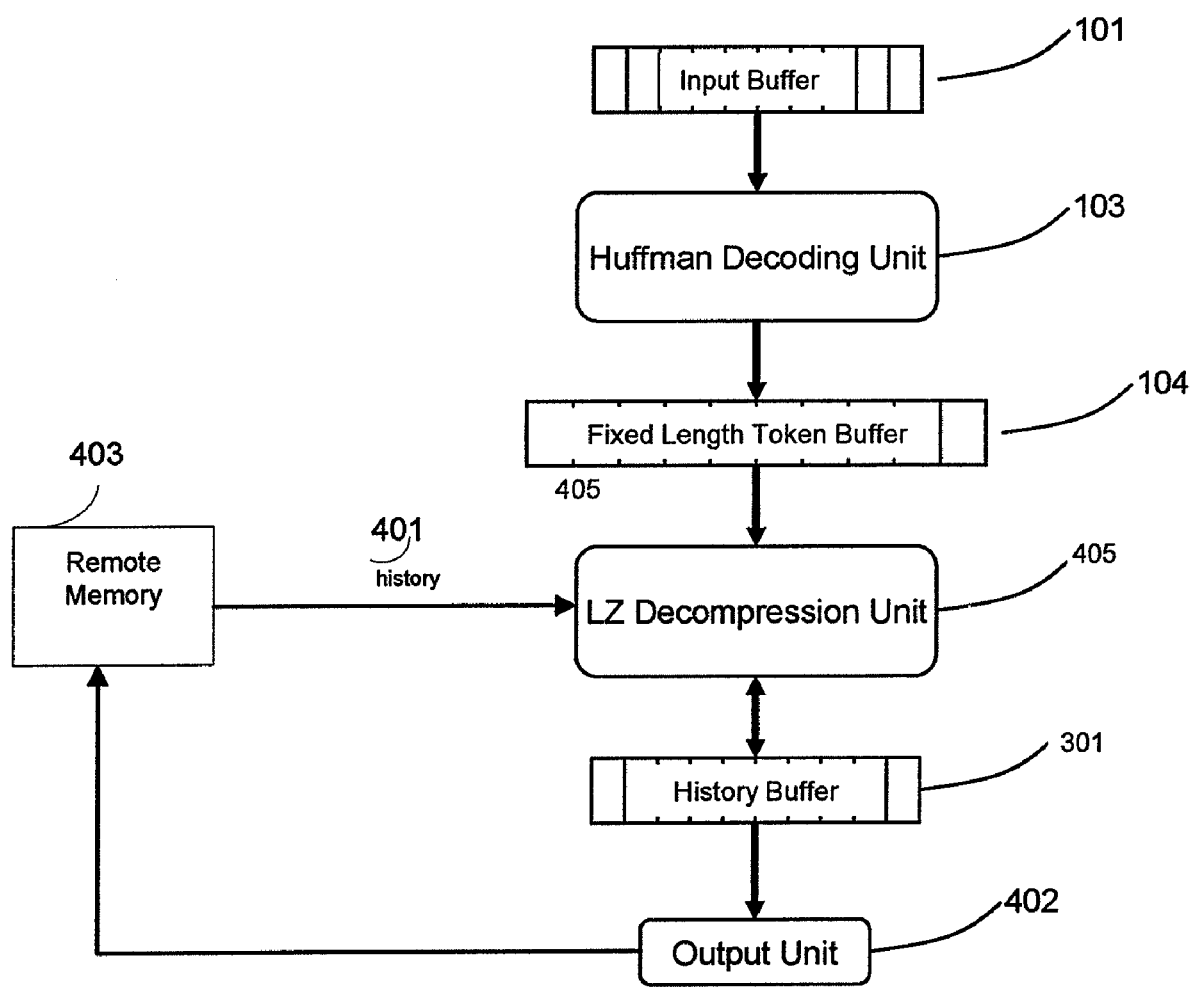
FIG. 4 shows a high-level block diagram of a decompression accelerator/engine according to an exemplary embodiment of the present invention.

FIG. 4 shows a high-level block diagram of a decompression accelerator/engine according to an exemplary embodiment of the present invention. The accelerator supports the Deflate decompression algorithm, which combines Huffman decoding with Lempel-Ziv decompression. The engine may be attached to a system's memory bus, where general packet inspection is performed by the system's CPUs (e.g. cores or hardware threads). The CPUs may communicate and synchronize with the accelerator through established mechanisms such as memory mapped input/output (MMIO). The accelerator of FIG. 4 has a similar organization to the accelerator shown in FIG. 1. However, different from LZ Decompression Unit 105 of FIG. 1, the LZ Decompression Unit 405 of FIG. 4 is configured to asynchronously fetch needed history data 401 (e.g., upwards of 258 bytes) onto the accelerator from remote memory 403. The accelerator also includes the history buffer 301 of FIG. 3. Further, the accelerator may include an Output Unit 402 that asynchronously fetches the data in history buffer 301 into the remote memory 403. The buffers depicted in FIG. 4 may be stored within a high speed memory such as a cache on the accelerator. The remote memory 403 may be main memory or a remote cache.

Figure 5:
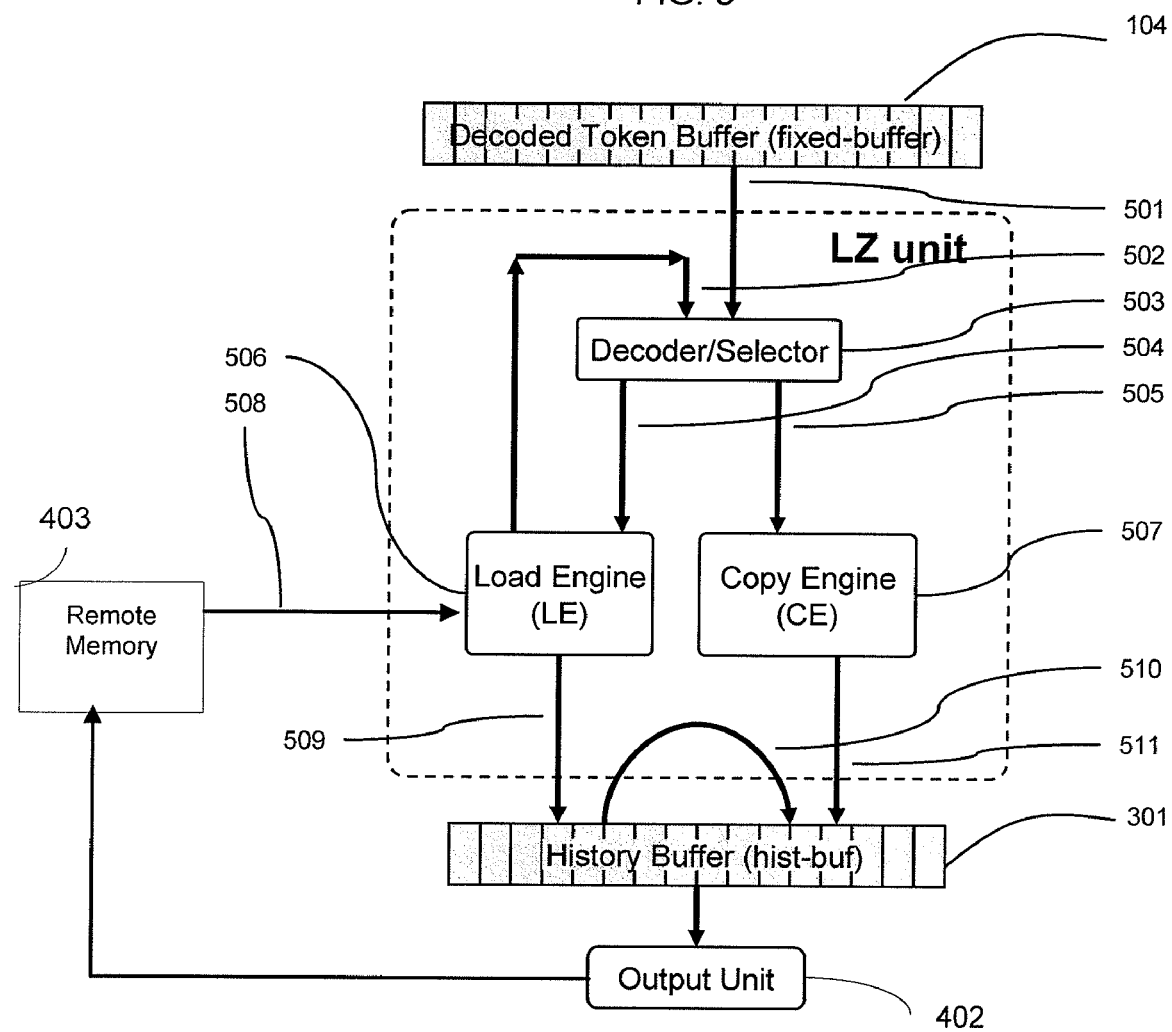
FIG. 5 shows an LZ decompression unit of FIG. 4, according to an exemplary embodiment of the present invention.

FIG. 5 shows the LZ Decompression Unit 405 of FIG. 4, according to an exemplary embodiment of the present invention. The LZ Decompression Unit 405 includes a Decoder/Selector unit 503, a Load Engine (LE) 506, and Copy Engine (CE) 507. When an LZ operation 501 is fetched 501 from the token buffer 104 into the LZ Decompression Unit 405, it is routed to the copy engine 507 or the load engine 506. When the LZ operation is a literal operation or a fast copy operation, the operation 505 is routed to the copy engine 507. Alternately, when the LZ operation is a slow copy operation, the operation 504 is routed to the load engine 506. The Engines 506 and 507 may include queues to queue up the operations until they can be processed. The Decoder/Selector 503 may delay sending the corresponding operations to the engines 506 and 507 when their respective queues are full. The Copy Engine 507 is responsible for performing string copies in the local memory of the accelerator. The duties of the copy engine 507 include moving data 509 from the Load Engine 506 to the history buffer 301, moving data 510 inside the history buffer 301, or writing literal bytes 511 to the history buffer 301. The Load Engine 506 is responsible for loading the history data needed by a list of copy operations onto the accelerator. Multiple outstanding slow copy operations are kept in the Load Engine 506. When the data for any such operations become available in the accelerator's memory, the operations are modified to reflect the altered copy-source and the operation instruction 502 is re-routed to the Copy Engine 507 through the Decoder/Selector 503.

Figure 6:
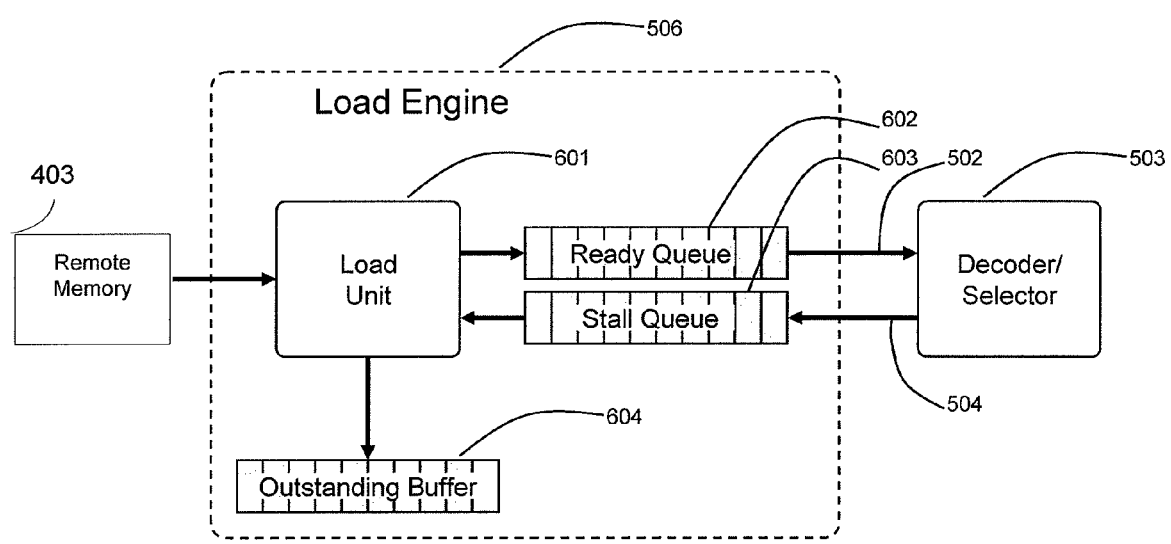
FIG. 6 shows a Load Engine of FIG. 5, according to an exemplary embodiment of the present invention.

FIG. 6 shows the Load Engine 506 of FIG. 5, according to an exemplary embodiment of the present invention. The Load Engine 506 includes a Load Unit 601, a Ready Queue 602, a Stall Queue 603, and an Outstanding Buffer 604. The Load unit 601 is responsible for taking LZ copy operations from the stall queue 603, and loading history data from the remote memory 403 when necessary. When the loading has completed, the Load Unit 601 stores the data into the Outstanding Buffer 604, alters the original slow copy operation into a new fast copy operation, and stores the new fast copy operation into the ready queue 602.

The operation of the Load Unit 601 is represented by the pseudocode illustrated in FIGS. 7a and 7b. Referring to FIG. 7a, in lines 701 and 718, the Load Unit 601 stays in an infinite loop checking for whether the Stall Queue 603 has copy operations. The LZ copy operation has three parameters: a copy source address (S), a copy destination address (D), and a copy length (L). The copy source and destination addresses are relative to a history buffer maintained in off-accelerator memory (e.g., the remote memory 403). Line 704 in FIG. 7a converts the parameters (e.g., S, D, and L) of the LZ copy operation to parameters (S', D', and L') for the load operation. For example the parameters for the load operation include a load source address in the off-accelerator memory (S'), a load destination address in the Outstanding Buffer 604 (D'), and a size of the copy in units of the memory loaded (L'). The unit of the memory load can be as small as a single cache line. FIG. 7b illustrates exemplary pseudo-code for above described conversion.

FIG. 8 illustrates pseudocode for logic of the Decoder/Selector 503 of FIG. 6, according to an exemplary embodiment of the present invention. FIG. 9 shows pseudo-code for the logic of an instruction conversion in the pseudo-code of FIG. 8, according to an exemplary embodiment of the present invention. Referring to FIG. 8, in line 801, the Ready Queue 602 is checked for the presence of a copy operation. When a copy operation is present in the Ready Queue 602, the copy operation is sent to the Copy Engine 507. When a copy operation is not present in the Ready Queue 602, the Decoder/Selector 503 fetches the LZ operation from the fixed buffer 104. The LZ operations in the fixed buffer 104 are either literal operations or copy operations. The copy operations are converted to the format of <S,D,L>, where the D is the same as the write pointer 206, L is the copy length, and S is D subtracted from a reference distance. Line 808 determines whether the source data of the copy is on the accelerator's memory or not. If the source data is on the accelerator's memory, an operation in the format of <S,D,L> is routed to the Copy Engine 507. However, if the source data is off the accelerator's memory, the operation is routed to the Load Engine 506. In line 817, the Decoder/Selector 503 determines whether the Stall Queue 603 of the load engine 506 is full before it can route the operations to the Load Engine 506. When the stall queue 603 is full, line 818 causes the Decoder/Selector 503 to wait until free slots in the Stall Queue 603 are available. The pseudocode of FIG. 9 specifies the conversion of an LZ operation into the <S,D,L> parameter format, which is performed in line 807. When the LZ operation is a literal operation, the length is specified as the literal in line 904, and the source 903 and destination 902 addresses are both set to the addresses indexed by the Write Pointer 206.

FIG. 10 shows pseudocode for logic of the Copy Engine 507 of FIG. 5, according to an exemplary embodiment of the present invention. The pseudocode of FIG. 10 selectively performs string copies inside the on-accelerator memory, including moving data 509 from the Load Engine 506 to the history buffer 301 on line 1005, moving data 510 inside the history buffer 301 on line 1007, or writing literal bytes 511 to the history buffer 301 on line 1002.

Lempel-Ziv compression tries to find the most recent recurrence of a substring. Accordingly, Lempel-Ziv decompression references the history data that immediately precedes the output generated by the currently active decompression request (e.g., recent history) more frequently than the history data further back. As a result, the availability of recent history in the fast memory has a more significant performance impact than the rest of the history. It can be beneficial to prefetch a small portion (e.g., 2 k or 4 k) of recent history into the accelerator before processing a decompression request. Further, there is more reuse of the data in recent history than the data in distant history. Prefetching recent history can reduce the total number of loads from a remote memory (e.g., main memory) and the corresponding delays. Prefetching a small amount of recent history from main memory should not introduce significant delay, and in addition, the prefetching of recent history data can be overlapped with the initialization of the Huffman Decoding Unit (e.g., receiving the input stream, loading the dynamic Huffman table (e.g., variable-length token table 106), etc.).

Figure 11:
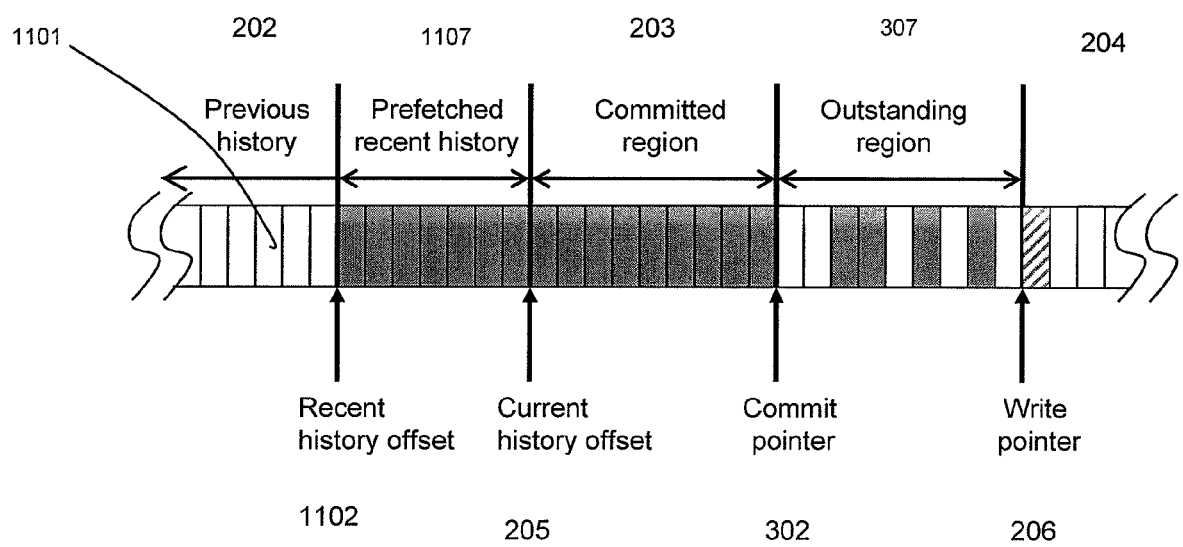
FIG. 11 shows a history buffer partitioned with prefetched recent history, according to an exemplary embodiment of the present invention.
Figure 12:
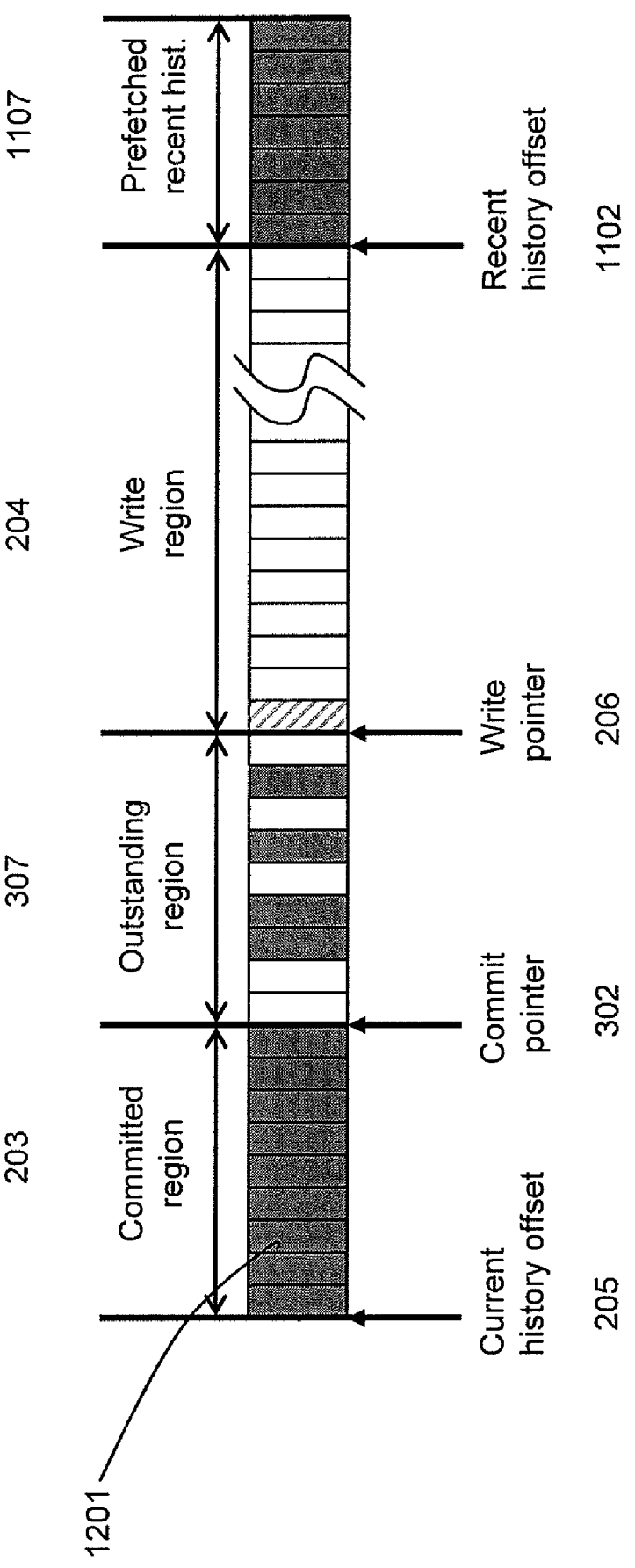
FIG. 12 shows the history buffer of FIG. 11 as a circular history buffer, according to an exemplary embodiment of the present invention.
Figure 13:
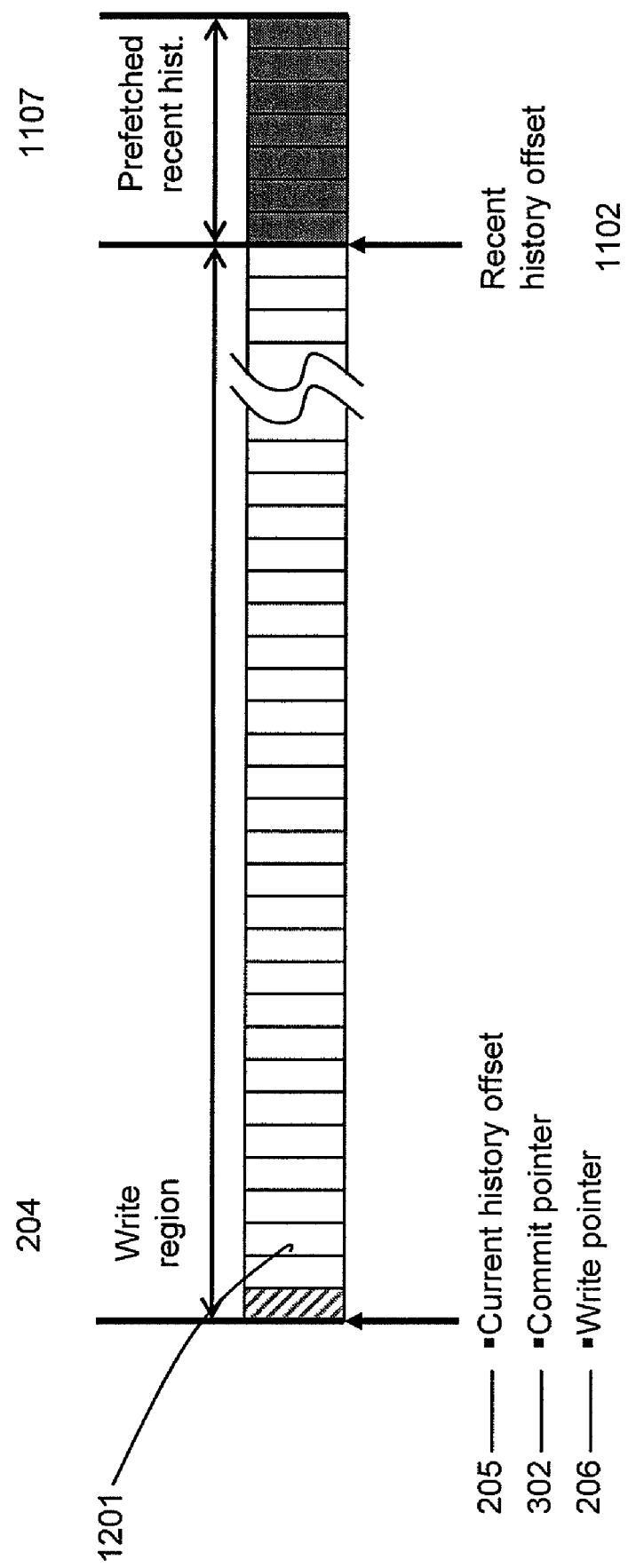
FIG. 13 illustrates the history buffer of FIG. 12 in an initial state, according to an exemplary embodiment of the present invention.

FIG. 11 shows a history buffer partitioned with prefetched recent history, according to an exemplary embodiment of the present invention. The history buffer 1101 has its history partitioned into a Prefetched Recent History Region 1107 and a Previous History Region 202. The two regions are separated by a Recent History Offset Pointer 1102. FIG. 12 shows the history buffer of FIG. 11 as a circular history buffer, according to an exemplary embodiment of the present invention. When using a circular buffer to implement the history buffer 1201 in the accelerator's fast memory, the buffer 1201 can be separated into four regions as shown in FIG. 12, where the recent-history is prefetched to the end of the circular history buffer 1201 into the Prefetched Recent History Region 1107. FIG. 13 illustrates the history buffer of FIG. 12 in an initial state, according to an exemplary embodiment of the present invention. Referring to FIG. 13, the Current History Offset Pointer 205, the Commit Pointer 302, and the Write Pointer 306 overlap, and the Committed Region 203 and Outstanding Region 307 are empty.

Figure 14:
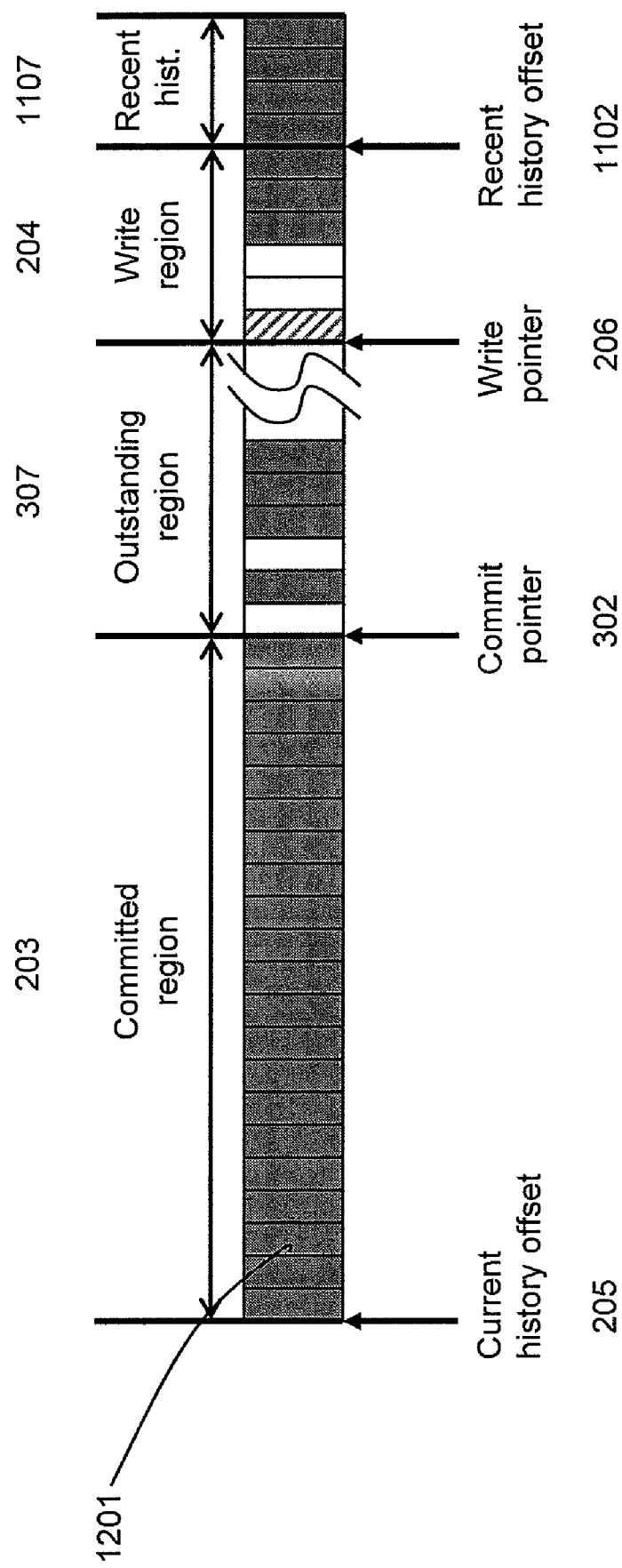
FIG. 14 shows the history buffer of FIG. 12 when prefetched history data is overwritten by most recently generated history data, according to an exemplary embodiment of the present invention.

FIG. 14 shows the history buffer of FIG. 12 when prefetched history data is overwritten by most recently generated history data, according to an exemplary embodiment of the present invention. FIG. 14 shows the circular buffer 1201 with a reduced size. The Write Region 204 can quickly advance to overlap with the Recent History Region 1107, and eventually overlap with the Committed Region 203. Reducing the size of the circular buffer 1201 in this way may cause the data in the Recent History Region 1107 and the Committed Region 203 to be overwritten, requiring them to be reloaded from the remote memory 403 (e.g., a main memory) when they are referenced later.

Figure 15:
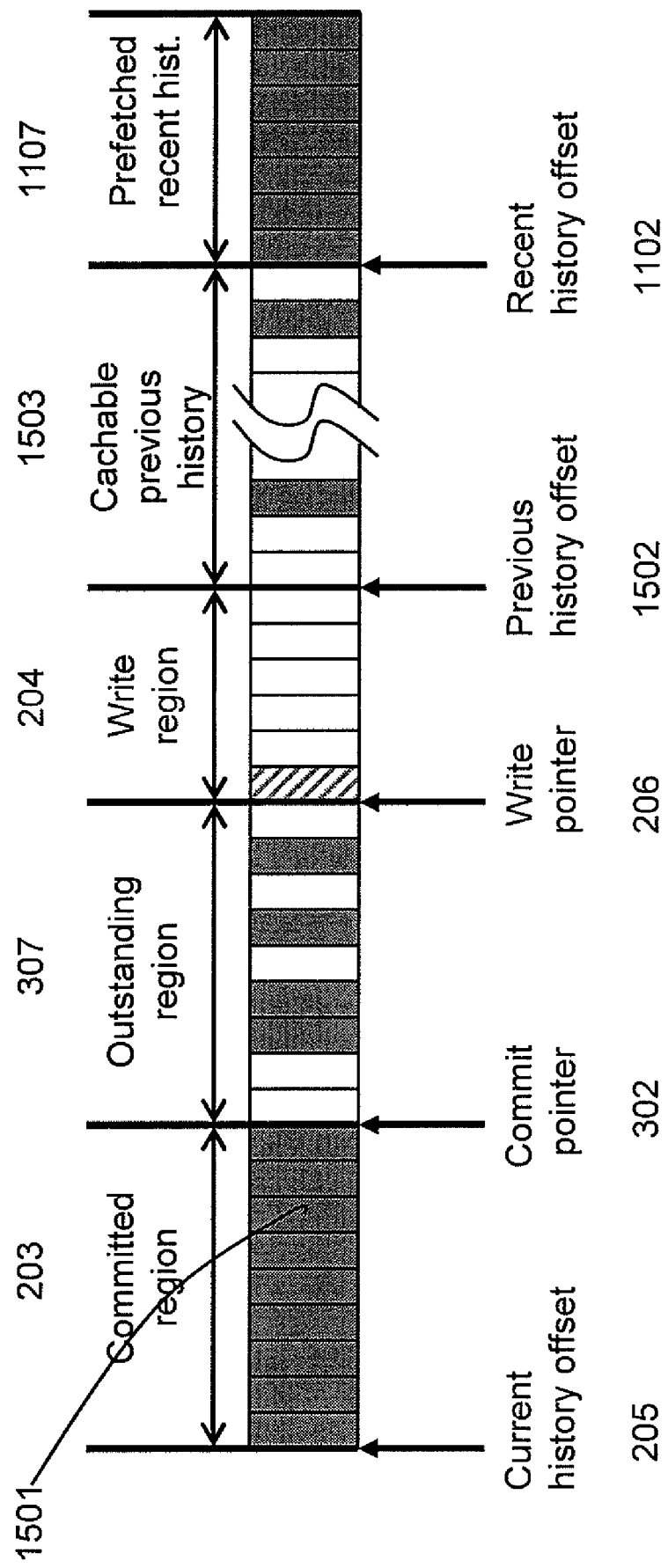
FIG. 15 shows a modified version of the history buffer of FIG. 12, which includes an additional caching region, according to an exemplary embodiment of the present invention.

FIG. 15 shows a modified version of the history buffer of FIG. 12, which includes a cachable previous history region 1503, according to an exemplary embodiment of the present invention. The cacheable region 1503 can store history that is frequently used in recent decompressions. A tag is maintained for each of the cache-aligned blocks in the cacheable region 1503 of the history buffer 1501. The tag is a bit that indicates whether a block is holding valid history data. The history buffer 1501 can retain history data in the cacheable region 1503 whose address falls in the cachable previous history region 1503, which is guarded by a Previous History Offset Pointer 1502 and the Recent History Offset Pointer 1102. The history buffer 1501 can cache data into the cacheable region 1503 whose addresses fall between the recent history offset and the previous history offset. In addition, the size of the cachable region is reduced while the Write Pointer 206 advances.

It is to be understood that the particular exemplary embodiments disclosed above are illustrative only, as the invention may be modified and practiced in different but equivalent manners apparent to those skilled in the art having the benefit of the teachings herein. Furthermore, no limitations are intended to the herein described exemplary embodiments, other than as described in the claims below. It is therefore evident that the particular exemplary embodiments disclosed herein may be altered or modified and all such variations are considered within the scope and spirit of the invention.

What is claimed is:

1. A method for decompressing a stream of a compressed data packet, the method comprising:
   determining whether first data of a data-dictionary for a first decompression copy operation is located in a history buffer on a remote memory or a local memory;
   when it is determined that the first data is located in the remote memory,
   stalling the first decompression copy operation;
   performing a second decompression operation using second data that is located in the history buffer on the local memory and fetching the first data from the remote memory to the history buffer on the local memory; and
   performing the first decompression operation using the first data in the history buffer on the local memory.

2. The method of claim 1, wherein the decompressing is performed using Lempel-Ziv decompression.

3. The method of claim 1, wherein the stalling comprises reserving a space in the history buffer on the local memory that is sufficient in size to fit the first data.

4. The method of claim 3, wherein fetching the first data comprises copying the first data from the remote memory to the reserved space in the history buffer on the local memory.

5. The method of claim 3, wherein performing the second decompression operation comprises outputting the second data into the history buffer on the local memory after the reserved space.

6. The method of claim 1, further comprises initially prefetching a portion of the data-dictionary into the history buffer on the local memory.

7. The method of claim 1, further comprises storing data of the data-dictionary used in a recent decompression into in a caching region of the history buffer on the local memory.

8. The method of claim 7, wherein determining whether the first data is located in the history buffer comprises:
   checking whether the first data is present in a region of the history buffer containing newly generated history;
   checking whether the first data is present in a region of the history buffer containing prefetched recent history; and
   checking whether first data is present in the caching region.

9. A system comprising a hardware decompression engine, the engine comprising:
   a history buffer configured to store data of a data-dictionary associated with a compressed data packet; and
   a decompression unit configured to asynchronously fetch data of the data-dictionary from a remote memory to the history buffer on the engine, to delay performing of a current decompression operation until its corresponding data has been fetched into the history buffer, and to perform a subsequent decompression operation based on the data in the history buffer while the first decompression operation is delayed.

10. The system of claim 9, wherein the history buffer comprises a committed region and an outstanding region, wherein the committed region includes contiguous data of the data-dictionary used in prior decompression operations and the outstanding region includes at least one space reserved for data of the data-dictionary corresponding to the delayed decompression operations.

11. The system of claim 10, wherein the history buffer further comprises a caching region for storing data of the data-dictionary that was previously copied from the remote memory when performing decompression operations.

12. The system of claim 11, wherein the caching region is associated with a bit vector indicating whether a unit of the data in the caching region contains valid data.

13. The system of claim 10, further comprising a commit pointer for referencing the committed region, wherein the commit pointer is advanced after the completion of each delayed decompression operation.

14. The system of claim 13, wherein the commit pointer is advanced after each copy into the history buffer when there is no delayed decompression operation.

15. The system of claim 9, further comprises an output unit that is configured to asynchronously store a part of the data in the history buffer to the remote memory.

16. The system of claim 9, wherein the decompression unit performs the decompression using Lempel-Ziv decompression.

17. The system of claim 16, further comprises a Huffman decoding unit to decode the compressed data packet into fixed length tokens, where the Huffman decoding unit operates asynchronously with the Lempel-Ziv decompression performed by the decompression unit in a pipelined fashion.

18. The system of claim 9, wherein the decompression unit comprises:
   a load engine configured to retrieve data of slow copy operations and store the retrieved data on the engine, wherein the data of the slow copy operations corresponds to data of the data-dictionary of the remote memory;
   a copy engine configured to copy literals of literal operations and data of fast copy operations to the history buffer, wherein the data of the fast copy operations corresponds to the data in the history buffer;
   a selector configured to route the fast copy operations and literal operations to the copy engine and route the slow copy operations to the load engine.

19. The system of claim 18, wherein the load engine comprises:
   an outstanding buffer;
   a ready queue;
   a stall queue configured to store the slow copy operations;
   a load unit configured to retrieve a slow copy operation from the stall queue, load the data of the slow copy operation from the remote memory into the outstanding buffer, modify the slow copy operation to generate a new fast copy operation, and place the new fast copy operation into the ready queue.

20. A program storage device readable by machine, tangibly embodying a program of instructions executable by the machine to perform method steps for decompressing a stream of compressed data packets, the method steps comprising:

determining whether first data of a data-dictionary for a first decompression copy operation is located in a history buffer on a remote memory or a local memory;

when it is determined that the first data is located in the remote memory, stalling the first decompression copy operation;

performing a second decompression operation using second data that is located in the history buffer on the local memory and fetching the first data from the remote memory to the history buffer on the local memory; and performing the first decompression operation using the first data in the history buffer on the local memory.

* * * * *